United States Patent
Parkinson et al.

(10) Patent No.: US 8,441,836 B2
(45) Date of Patent: May 14, 2013

(54) SECTOR ARRAY ADDRESSING FOR ECC MANAGEMENT

(75) Inventors: Ward Parkinson, Boise, ID (US); Thomas Trent, Nashua, NH (US)

(73) Assignee: Ovonyx, Inc., Sterling Heights, MI (US)

( * ) Notice: Subject to any disclaimer, the term of this patent is extended or adjusted under 35 U.S.C. 154(b) by 137 days.

(21) Appl. No.: 12/884,413

(22) Filed: Sep. 17, 2010

(65) Prior Publication Data

US 2012/0069622 A1    Mar. 22, 2012

(51) Int. Cl.
*G11C 11/00*    (2006.01)

(52) U.S. Cl.
USPC .......................................... 365/148; 365/158

(58) Field of Classification Search .................. 365/148, 365/158, 163, 171, 149
See application file for complete search history.

(56) References Cited

U.S. PATENT DOCUMENTS

| | | | |
|---|---|---|---|
| 6,462,984 B1 | 10/2002 | Xu et al. | |
| 2004/0090809 A1* | 5/2004 | Tran | 365/100 |
| 2007/0058413 A1* | 3/2007 | Lin et al. | 365/145 |
| 2008/0205121 A1* | 8/2008 | Chen et al. | 365/158 |
| 2008/0273365 A1* | 11/2008 | Kang et al. | 365/51 |

* cited by examiner

*Primary Examiner* — Vu Le
(74) *Attorney, Agent, or Firm* — Kevin L. Bray (57) ABSTRACT

An addressing scheme for non-volatile memory arrays having short circuit defects that manages the demand for error correction. The scheme generally avoids simultaneous active driving of the row line and column line of the selected cell during write. Instead, only a single row or column line is actively driven at any one time and all other array lines are left floating. In addition, the number of memory cells accessed from a given row or column during a fetch may be limited. The benefits of the scheme include preventing short circuits from drawing excess currents through the array and limiting the frequency of read or write failures caused by short circuits to a manageable number. In one embodiment, the scheme maintains the demand for error correction to within the error correction capability of a flash controller. Exemplary embodiments include phase-change memory arrays.

46 Claims, 6 Drawing Sheets

SECTOR ARRAY ADDRESSING FOR ECC MANAGEMENT

FIELD OF INVENTION

This invention relates to error correction in an electronic memory array. More particularly, this invention relates to error correction in an electronic memory array that includes short circuit defects. Most particularly, this invention minimizes the number of cells subject to read or write errors as a consequence of short circuit defects.

BACKGROUND OF THE INVENTION

Electronic memory is widely used in consumer and commercial applications. The different types of electronic memory are broadly classified as volatile or non-volatile. Volatile memory includes SRAM and DRAM and is advantageous because it provides fast reading and writing operations (SRAM) and high density (DRAM). Volatile memory suffers from the disadvantage, however, that its data content is lost when the memory is powered down. Non-volatile memory, in contrast, retains its data when powered down. Non-volatile memory includes EPROM, EEPROM, and Flash. As markets have expanded, volatile and non-volatile memories have evolved to address different application needs. Volatile memory is preferred in applications in which speed or endurance is a premium, while non-volatile memory has been emphasized in applications where persistent data retention without a need to restore or refresh data is important.

Electronic memory is frequently configured as an array that includes a set of bit lines and a set of word lines with a memory cell disposed between each bit line and each word line. Bit lines may also be referred to as column lines and word lines may also be referred to as row lines. The memory cell includes at least an active memory material that is capable of being electrically converted between two or more distinguishable memory states and typically further includes an access device to uniquely address a memory element, such as a transistor or diode, in series with the memory element material to regulate electrical access to the memory material and minimize leakage current when deselected. The array is operated by applying an addressing scheme to select a targeted memory cell for an access operation (read, write, erase). The addressing scheme typically involves selective application of a pattern of bias voltages to the bit lines and word lines of the array. The bit lines and word lines of unselected cells are typically held at a reference voltage, while the voltage of the bit line and/or word line of the selected cell is/are raised or lowered relative to the reference voltage to bias the flow of current through the selected cell to achieve the desired access operation.

Flash memory is presently the higher volume non-volatile electronic memory technology. The flash memory cell is based on a floating-gate MOS transistor. The flash cell includes source and drain regions formed in a substrate and a gate structure that includes a floating gate and control gate. The floating gate is positioned above the substrate and separated from the substrate by a tunnel oxide. The control gate is positioned above the floating gate and separated from it by a dielectric. The floating gate is complete surrounded by dielectric materials and capacitively controlled by the control gate. Since the floating gate is electrically isolated, it can store charge and the separate memory states of the flash cell are defined according to the amount of charged stored at the floating gate. The different charge states of the floating gate influence the voltage needed at the control gate to turn on the transistor. The threshold voltage of the transistor changed by writing to the cell, is determined by measuring current when the voltage is applied to the control gate, and becomes the metric by which the different memory states of the flash cell are distinguished. The threshold voltage, in turn, is a manifestation of the amount of charge stored (programmed or injected) on the floating gate.

The architecture and layout of flash cells in an array can be varied and used to define different forms of flash memory. NOR flash and NAND flash are the prevailing forms of flash in today's market. NAND flash is a high-volume technology that is optimized for large data storage applications, while NOR flash is a more specialized and more versatile technology that is directed to both code storage applications. Much of the recent growth in the adoption of Flash memory has occurred because of its successful implementation into portable electronic devices. Flash memory is widely used in cell phones, cameras, media players, and mobile computing and has proven to be a reliable commercial technology.

Expansion of flash memory volume has been assisted by an evolution and lowering of flash memory cost in the transition from single bit to multilevel operation. This evolution has significantly increased the data storage density of flash memory and has made a number of compact product applications possible. One factor underlying multilevel operation of flash memory (especially NAND flash) is a robust error correction capability. Flash memory cells are potentially subject to a number of errors that affect data integrity. The different errors may be collectively referred to as "bit" errors and for simplicity, the individual memory cells may be referred to as "bits". Bit errors may originate from access operations, configuration defects in the array, or a combination of the two. Errors originating from access operations occur through errors in the access protocol or when a correct access protocol induces unintended effects in the array. Configuration defects are structural defects and include problems such as short circuits and open circuits caused by defects in the memory elements in the array or addressing and drive elements (transistors, diodes, and interconnect). Configuration defects may occur at the time of manufacture or develop over time through use of the array. Bit errors include write errors, write-disturb errors, data retention errors (caused by leakage of charge from the floating gate), read errors, and read-disturb errors. As the number of states utilized in flash memory increases, the detection margin for the different states narrows and the technology becomes more susceptible to errors and the need to correct errors becomes more pressing.

Error correction capability is typically provided by the controller used to operate flash memory. Most error correction schemes involve the use of check data bits dedicated to error correction and an error correction algorithm. The check data bits are redundant bits that are included in the memory array and represent chip overhead that needs to be minimized. Popular error correction algorithms include the Hamming code, the Bose-Chaudhiri-Hocquenghem (BCH) code (NAND), the Reed-Solomon (RS) code (NAND), and the trellis coded modulation (TCM) (NOR). Information on implementation of error correction codes in flash memory can be found in Gregori, S. et al., "On-Chip Error Correcting Techniques for New Generation Flash Memories"; Proc. IEEE 91(4) 602-616 (2003).

As efforts toward chip miniaturization continue, the scaling of flash memory to smaller dimensions is becoming increasingly problematic. Problems include difficulties in reliably fabricating ever thinner oxide regions for separating the floating gate from both the substrate and the control gate and loss of margin in read and write operations. The loss of margin is a consequence of the fact that the amount of charge that can be stored on the floating gate necessarily decreases as the dimensions of the floating gate are reduced. A reduction in charge makes detection of charge more demanding and is especially problematic in multilevel designs because it becomes increasingly difficult to discriminate states on the basis of charge as the differential in charge between the different states is reduced. Flash memory is also prone to data retention errors due to charge dissipation from the floating gate. Charge dissipation currently limits the cycle life of flash memory and is expected to become more pronounced as scaling continues to smaller dimensions.

Concerns over the future scalability of flash memory have motivated development efforts directed to alternative non-volatile memory technologies. Technologies in the development phase include FeRAM, MRAM, resistive RAM (e.g. memristors), and phase-change memory. In phase-change memory, the memory cell includes a phase-change material as the active memory material and an access device. A phase-change material is a material that exhibits multiple resistance states according to the structural phase of the material. Phase-change materials are reversibly transformable between a high resistance amorphous state and a low resistance crystalline state and can also adopt a continuum of mixed amorphous-crystalline states in which the relative proportions of amorphous phase and crystalline phase content can be varied continuously to provide programming states of intermediate resistance. Chalcogenide materials are one important class of phase-change materials and include a chalcogen element (usually Te and/or Se) along with one or more modifying elements selected from column III (e.g. Ga, In), IV (e.g. Si, Ge or Sn), or V (e.g. As or Sb) of the periodic table. $Ge_2Sb_2Te_5$, for example, is one of the more common phase-change materials. Further information about phase-change memory may be found in U.S. Pat. Nos. 7,767,992; 7,718, 990; 7,706,178; 6,859,390; and 6,671,710; the disclosures of which are hereby incorporated by reference herein.

In order to facilitate commercial adoption of phase-change memory as a replacement for flash memory, it is desirable to exploit as much of the manufacturing infrastructure available for flash memory as possible. In particular, it is desirable to develop a phase-change memory module that is compatible with a flash controller so that phase-change memory can serve as a drop-in replacement for flash memory. In order to achieve this goal, however, it is necessary to develop an error correction scheme for phase-change memory that is within the error correction capability of a standard flash controller. In a typical error correction scheme for flash memory, 16 check bits are used per 512 fetched data bits (sector) to provide an error correction capability of 4-6 bits correctable per sector fetched. Other alternatives are possible or used, such as fetching 64 check bits per 2056 fetched data bits (page).

At the present time, phase-change memory arrays are addressed using a conventional sequential access scheme in which the word line is addressed and remains fixed while the bit lines are sequentially addressed one at a time to read or write a sector (or page). When errors are detected, bad bits are corrected by the controller before passing onto the MPU requesting the read. Within the memory, the bad bits may be left alone or rewritten, or replaced by swapping in a replacement bit or recording the address of the bad bit location in a lookup table and mapping in a corrected data value. Bit replacement typically involves swapping in redundant bits through a fusing process (such as laser fusing in which a metal line is opened or a dielectric barrier layer is ruptured to form a short, thereby providing a bit state to detect to allow swapping out the bit, row, or column line. Bit replacement, however, is an undesirable process because fusing is time consuming at wafer probe and burdensome in requiring dedicated chip area for redundant bits, thereby increasing the footprint of phase-change memory and wasting space. These aspects tend to raise costs but improve yields, a tradeoff that may be less than favorable. A further negative of fuse repair redundancy is the detection adds to access complexity and can slow performance. And the redundancy is usually not engaged in the field, so bits that deteriorate in the field are not repairable by redundancy, only by ECC. Hence it is desirable to achieve adequate repair of bad bits at the factory and in the field by ECC alone, without redundancy. If major sections can be can be corrected, as in this invention, then the chip can be implemented beneficially with or without redundancy by fuse repair (the fuse repair enhancing correctability, but not being required for commercial chip manufacture).

Adaptation of error correction schemes employed for flash memory to phase-change memory can obviate the need for fuse repair. If the phase-change memory array were free from configuration or addressing defects, implementation of flash-type error correction codes with phase-change memory would be straightforward. In practice, however, errors do occur during manufacturing and defects do arise upon repeated use of the memory. Configuration defects in phase-change memory arrays include short circuits between word lines (e.g. metal to metal shorts), short circuits between bit lines (e.g. metal to metal shorts), short circuits between a word line and a bit line (such as through a shorted memory cell), open circuits along a word line, and open circuits along a bit line.

The presence of short circuit and open circuit defects in phase-change memory complicates adaptation of the conventional error correction codes used in flash controllers because they cause the number of bad bits encountered in the conventional addressing scheme to exceed the capacity of the flash controller to correct errors. When a short circuit or open circuit defect is encountered at a particular word line during a conventional sequential accessing scheme, for example, all or most of a row of memory cells may be rendered unreliable or inaccessible within the sector or page addressed, easily exceeding 100 bits. As a result, the number of memory cells for which data correction is required can readily exceed the capacity of a standard flash controller, usually limited to 4 to 6 depending on the controller company and algorithm used (as is one reasonably familiar with the art).

Although a new controller could be designed specifically for phase-change memory (or other non-volatile memory technologies), it is desirable to avoid the cost and time delay needed to do so. Instead, it is preferable to maintain compatibility with flash memory and to benefit from the existing manufacturing infrastructure for flash memory. There is accordingly a need for alternative memory array technologies that can scale to smaller dimensions while having an error correction capability that manages the number of defective bits to a number within the capability of a standard flash controller.

SUMMARY OF THE INVENTION

This invention provides an addressing scheme for electronic memory arrays that manages error correction. The addressing scheme is well suited to arrays that contain configuration defects such as short circuits or open circuits between row and/or column lines. The addressing scheme minimizes the effect of a configuration defect on data integrity by reducing the number of memory cells that need correction as a consequence of the configuration defect. The addressing scheme limits the number of memory cells requiring correction to be within the flash memory controller capability, even for shorts or opens on the word or bit line.

In one embodiment of the addressing scheme, no more than 4 bits are fetched from a given word line addressed within a page or sector, and the word line or bit line of the selected memory cell is actively driven and all other word lines and bit lines of the array are not actively driven and instead are left floating. In another embodiment of the addressing scheme, both the word line and bit line of the selected memory cell are actively driven, while all other word lines and bit lines of the array are left floating.

In one embodiment, the addressing scheme includes a precharge step at the close of an active cycle or upon powering up the chip, initiation of an active (read or write) cycle, execution of the active cycle, and close of the active cycle.

The precharge step may include simultaneously precharging all bit lines to an unselected state while floating all word lines and subsequently floating all bit lines while precharging all word lines to an unselected state. Alternatively, all word lines may be precharged to an unselected state while floating all bit lines and subsequently all word lines may be floated while precharging all bit lines to an unselected state.

Initiation of the active cycle includes supplying the address of the selected memory cell to the array either directly or through a controller. The address includes the address of the word line and bit line of the selected cell. Initiation may also include charging one or more holding capacitors. In one embodiment, one or more holding capacitors are charged with sufficient energy to program the selected memory cell. The selected word line is then actively driven to a select state and optionally connected to a holding capacitor, while all other word lines and all bits lines are floated. In one embodiment, the drive of the selected word line is next discontinued. In another embodiment, depending on the current limiting capability of the driver circuit, the drive of the selected word line is continued.

To execute the active cycle, the selected bit line is actively driven to a select state. If the cycle is performing a read operation, the current that develops on the bit line is governed by the state of the selected memory cell and may be detected as a high or low voltage across a load resistor depending on the state of the selected memory cell and the active cycle is closed. If the cycle is performing a write operation, the selected row line is connected to (or remains connected to) a holding capacitor to program the selected memory cell to one programming state (e.g. the set state of a phase-change memory cell) and is disconnected from (or never connected to) a holding capacitor to program the selected memory cell to another programming state (e.g. the reset state of a phase-change memory cell). The actively-driven bit line then induces current flow through the selected memory cell to transform it to the desired programming state.

To close the active cycle, any remaining connections between drivers or capacitors to the selected word line or selected bit line are discontinued. Upon closing of the active cycle, the precharging step of the array drivers and decoders to an unselected state may be performed again to ready the array for the next access cycle.

DETAILED DESCRIPTION OF THE ILLUSTRATED EMBODIMENTS

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

This invention provides an addressing scheme for electronic memory arrays. The addressing scheme is especially adapted to keeping the demands of error correction to within limits of the ECC method used to analyze and correct the data stored or fetched. In one embodiment, the demands of error correction are maintained within the error correction capabilities of a conventional flash controller. By managing error correction to maintain compatibility with a standard flash controller, commercial adoption of promising non-volatile alternatives to flash memory is expected to be facilitated and the anticipated scaling limits of flash memory can be circumvented.

In the following discussion, implementation of the instant invention will be described in the context of phase-change memory as an alternative non-volatile memory technology, as a replacement of the Nand (or Nor) Flash, and having either an on-chip or off-chip controller having some limited capacity to electronically correct errors in bits fetched in parallel (e.g. Hamming code correction) or to correct errors in sets of bits (multiple bytes or words) (e.g. Reed-Solomon correction). The behavior (including switching, memory, and accumulation) and chemical compositions of phase-change materials has been described, for example, in the following U.S. Pat. Nos. 6,671,710; 6,714,954; 6,087,674; 5,825,046; 5,687,112; 5,912,839; 5,596,522; 5,536,947; 5,534,711; 5,296,716; 5,166,758; and 3,530,441, the disclosures of which are hereby incorporated by reference. It is to be understood, however, that the instant addressing scheme can be readily adapted by those of skill in the art to other non-volatile memory technologies including Flash, FeRAM, MRAM, resistive RAM (ReRAM or memristors), programmable metallization materials, polymer memory materials, metal nanoparticle memory materials, other classes of materials transformable between two or more states distinguishable on the basis of structure, physical property or chemical property, and other classes of electrical switching materials. The discussion begins with a review of relevant aspects of phase-change memory technology and proceeds to a consideration of the instant addressing scheme as applied to phase-change memory arrays.

An important feature of phase-change memory materials is their ability to undergo a phase transformation between or among two or more structural states. The phase-change materials have structural states that may include a crystalline state, one or more partially-crystalline states and an amorphous state. The crystalline state may be a single crystalline state or a polycrystalline state. A partially-crystalline state refers to a structural state in which a volume of chalcogenide or phase-change material includes an amorphous portion and a crystalline portion. A partially-crystalline state may also be referred to herein as a mixed crystalline-amorphous state. Generally, a plurality of partially-crystalline states exists for the chalcogenide or phase-change material that may be distinguished on the basis of the relative proportion of the amorphous and crystalline portions. Fractional crystallinity is one way to characterize the structural states of a chalcogenide phase-change material. The fractional crystallinity of a purely crystalline state is 100%, the fractional crystallinity of a purely amorphous state is 0%, and the fractional crystallinities of the partially-crystalline states may vary continuously between 0% (the amorphous limit) and 100% (the crystalline limit). Phase-change materials are generally able to transform among a plurality of structural states that vary inclusively between fractional crystallinities of 0% and 100%.

Transformations among the structural states are induced by providing energy in a controlled manner to the phase-change material. Energy in various forms can induce structural transformations of the crystalline and amorphous portions. Suitable forms of energy include one or more of electrical energy, thermal energy, optical energy or other forms of energy (e.g. particle-beam energy) that induce electrical, thermal or optical effects in a phase-change material. Continuous and reversible variability of the fractional crystallinity is achievable by controlling the amount of energy and the rate at which energy is provided to the phase-change material. A crystalline state can be transformed to a partially-crystalline or an amorphous state, a partially-crystalline state can be transformed to a crystalline, amorphous or different partially-crystalline state, and an amorphous state can be transformed to a partially-crystalline or crystalline state through proper control of the energy environment of a chalcogenide phase-change material.

The use of energy to induce structural transformations exploits the thermodynamics and kinetics associated with the crystalline to amorphous or amorphous to crystalline phase transitions. An amorphous phase may be formed, for example, from a partially-crystalline or crystalline state by heating a phase-change material above its melting temperature and cooling at a rate sufficient to inhibit the formation of crystalline phases. A crystalline or higher fractional crystallinity phase may be formed from an amorphous or partially-crystalline state, for example, by heating a phase-change material above the crystallization temperature for a sufficient period of time to effect nucleation and/or growth of crystalline domains. The crystallization temperature is below the melting temperature and corresponds to the minimum temperature at which crystallization may occur.

The driving force for crystallization is typically thermodynamic in that the free energy of a crystalline or partially-crystalline state is typically lower than the free energy of an amorphous state so that the overall energy of a phase-change material decreases as the fractional crystallinity increases. Formation (nucleation and growth) of a crystalline state or crystalline domains within a partially-crystalline or amorphous state is kinetically enabled up to the melting temperature, so that heating promotes crystallization by providing energy that facilitates the rearrangements of atoms needed to form crystalline phases or domains.

The fractional crystallinity of a partially-crystalline state can be controlled by controlling the temperature or time of heating of the partially-crystalline state or by controlling the temperature or rate of cooling of an amorphous or partially-crystalline state. Through proper control of the peak temperature, time of heating and rate of cooling, structural states over the full range of fractional crystallinity can be achieved for the phase-change materials. To increase the amorphous phase content of a phase-change material, it is necessary to provide sufficient energy to raise the temperature of the phase-change material to the melting temperature and then to cool the phase-change material at a rate sufficiently fast to inhibit crystallization. Increases in amorphous phase content are thus typified by a large energy input followed by rapid cooling. To increase the crystalline phase content of the phase-change material, lower amounts of energy and slower cooling are required. The initial energy input needed to increase crystalline phase content need only be sufficient to increase the temperature of the phase-change material to the crystallization temperature. Slower cooling is required to insure that sufficient time is available to permit crystallization.

The use of electrical energy to induce structural transformations relies on the application of electrical (current or voltage) pulses to a phase-change material. The mechanism of electrically-induced structural transformations is based on Joule heating, which is created by resistance to current flow. Joule heating corresponds to a conversion of electrical energy to thermal energy and leads to an increase in the temperature of the phase-change material. By controlling the current density, the peak temperature and rate of cooling of a phase-change material can be controlled.

The crystalline phase portions of a phase-change material are sufficiently conductive to permit current densities that provide efficient Joule heating. The amorphous phase portions, however, are much less conductive and ordinarily would not support current densities sufficient to heat the material to the crystallization temperature. As is known in the art, however, the amorphous phase of a phase-change material can be electrically switched to a highly conductive intermediate (dynamic) state upon application of a voltage greater than the threshold voltage. In the dynamic state, the material can support a current density that is high enough to heat the material to the crystallization temperature through Joule heating.

Figure 1:
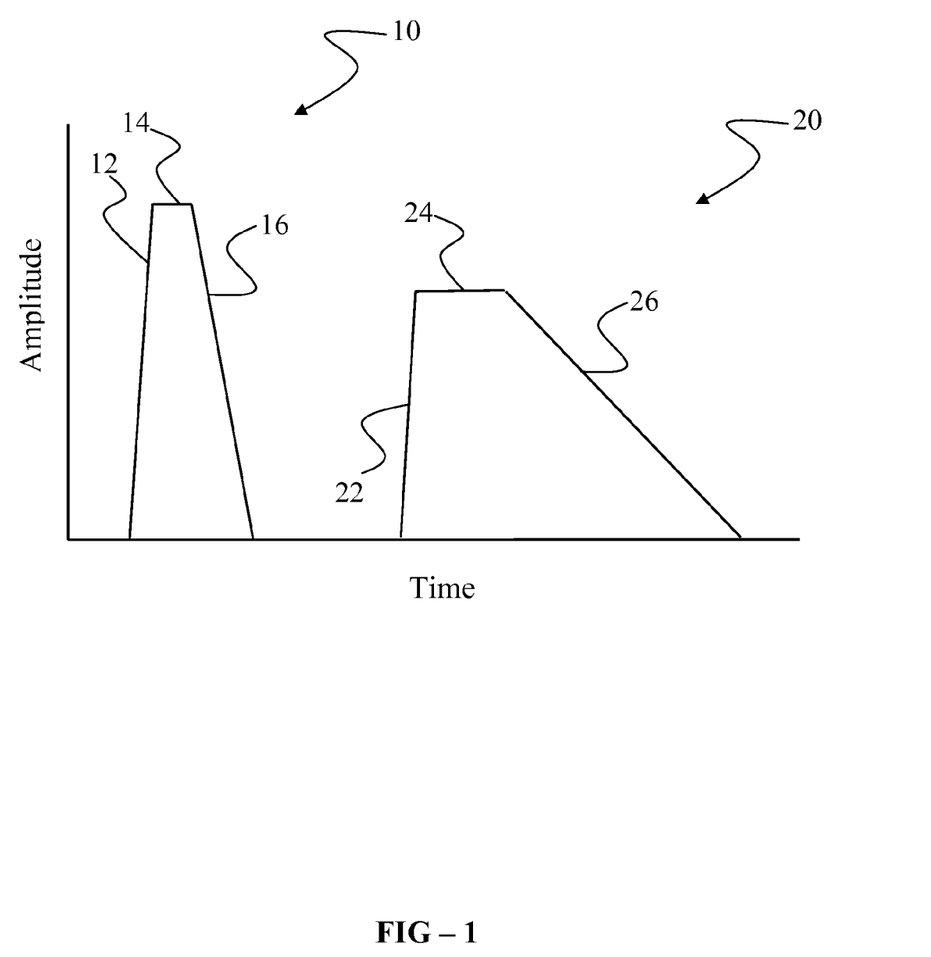
FIG. 1 is a depiction of electrical pulses that may selectively increase the amorphous or crystalline phase content of a phase-change material.

By controlling the magnitude and/or duration of electrical pulses applied to a phase-change material, it is possible to continuously vary the fractional crystallinity through controlled interconversion of the crystalline and amorphous phases. FIG. 1 illustrates representative electrical pulses that may be used to influence the relative proportions of crystalline and amorphous phases in a phase-change material. Electrical pulse 10 is representative of a pulse that may be used to increase the amorphous phase content. Electrical pulse 10 includes leading edge 12, plateau 14, and falling edge 16. Noteworthy characteristics of electrical pulse 10 include a relatively high peak amplitude and a rapid falling edge. The peak amplitude is designed to insure that Joule heating increases the temperature of the material to or above the melting point and the timescale of the falling edge is designed to rapidly quench the material to inhibit crystallization. Electrical pulse 20 is representative of a pulse that may be used to increase the crystalline phase content. Electrical pulse 20 includes leading edge 22, plateau 24, and falling edge 26. Noteworthy characteristics of electrical pulse 10 include relatively low peak amplitude and a gradual falling edge. The peak amplitude is designed to insure that Joule heating increases the temperature of the material to between the crystallization temperature and melting point, while the timescale of the falling edge is designed to be slow enough to provide sufficient time to promote crystallization. The amplitude of the electrical pulse 20 may be less than the electrical pulse 10, or in a simpler implementation the pulse may be about the same or greater than the amplitude of the pulse 10. Similarly, the width of the pulses may be about the same, so long as it is adequate to induce (respectively) melting when writing a bit to the amorphous (higher resistance) state and a temperature of at least the crystallization temperature when writing a bit to the crystalline (lower resistance) state.

Figure 2:
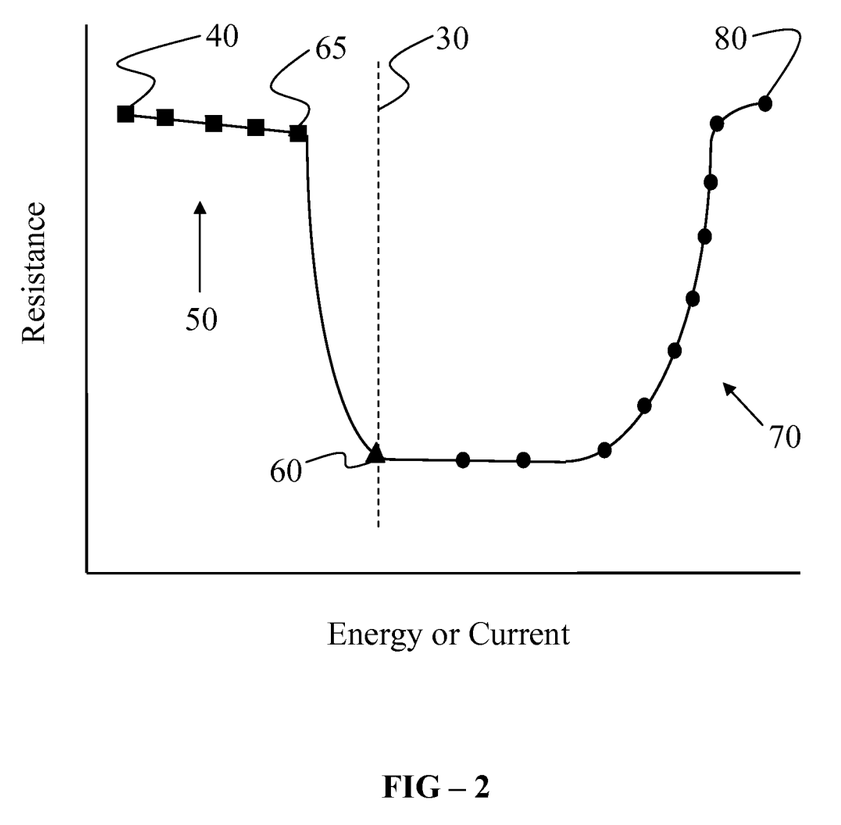
FIG. 2 is an illustrative Resistance vs. Energy/Current plot for a chalcogenide phase-change material.

The R-I response is a meaningful depiction of the characteristics of phase-change memory devices and is one manifestation of the effect of structural transformations associated with the crystalline-amorphous phase-change process on electrical properties. A representative depiction of the electrical resistance (R) of a chalcogenide memory device as a function of electrical energy or current pulse magnitude (Energy/Current) is presented in FIG. 2. FIG. 2 may generally be referred to as a resistance plot.

The resistance plot includes two characteristic response regimes of the device to electrical energy. The regimes are approximately demarcated with the vertical dashed line 30 shown in FIG. 2. The regime to the left of the line 30 may be referred to as the accumulating regime of the phase-change material. The accumulation regime is distinguished by a nearly constant or gradually varying electrical resistance with increasing electrical energy until a highly conducting state is reached. The accumulation regime extends, in the direction of increasing energy, from the leftmost point 40 of the resistance plot, through a plateau region (generally depicted by 50) corresponding to the range of points over which the resistance variation is small or gradual to the set point or state 60 that follows an abrupt decrease in electrical resistance. The plateau 50 may be horizontal or sloping.

The left side of the resistance plot is referred to as the accumulating regime because the structural state of the phase-change material cumulatively evolves as energy is applied. The fractional crystallinity of the structural state correlates with the total accumulation of applied energy. The leftmost point 40 corresponds to the structural state in the accumulating regime having the lowest fractional crystallinity and may be referred to as the reset state. This state may be fully amorphous or may be primarily amorphous with some degree of crystalline content. As energy is added, the phase-change material progresses among a plurality of partially-crystalline states with increasing fractional crystallinity along plateau 50. Selected accumulation states (structural states in the accumulation region) are marked with squares in FIG. 2.

Upon accumulation of a sufficient amount of applied energy, the fractional crystallinity of the phase-change material increases sufficiently to effect a setting transformation, which is characterized by a dramatic decrease in electrical resistance and stabilization of the set state 60. Structural transformations in the accumulating regime are unidirectional in the sense that they progress in the direction of increasing applied energy within the plateau region 50 and are reversible only by first driving the phase-change material through the set point 60 and into the direct overwrite regime 70 and resetting (melting and then rapidly quenching the device after a current of at least the reset current amplitude is applied). Once reset state 80 is obtained, lower amplitude current pulses can be applied and the accumulation response of the phase-change material can be retraced. It is possible to reversibly transform between the set and reset states over multiple cycles of operation.

While not wishing to be bound by theory, it is believed that the addition of energy to a phase-change material in the accumulating regime leads to an increase in fractional crystallinity through the nucleation of new crystalline domains or growth of existing crystalline domains or a combination thereof. It is further believed that the electrical resistance varies only gradually along the plateau 50, despite the increase in fractional crystallinity, because the crystalline domains form or grow in relative isolation of each other so as to prevent the formation of a contiguous crystalline network that spans the chalcogenide material between the two device electrodes. This type of crystallization may be referred to as sub-percolation crystallization.

The setting transformation coincides with a percolation threshold in which a contiguous, interconnected crystalline network forms within the chalcogenide material and bridges the space between the two electrodes of the device. Such a network may form, for example, when crystalline domains increase sufficiently in size to impinge upon neighboring domains. Since the crystalline phase of chalcogenide materials is more conductive and less resistive than the amorphous phase, the percolation threshold corresponds to the formation of a contiguous low resistance conductive pathway through the chalcogenide material. As a result, the percolation threshold is marked by a dramatic decrease in the resistance of the chalcogenide material. The leftmost point 40 of the accumulation regime may be an amorphous state or a partially-crystalline state lacking a contiguous crystalline network. Sub-percolation crystallization commences with an initial amorphous or partially-crystalline state and progresses through a plurality of partially-crystalline states having increasingly higher fractional crystallinities until the percolation threshold is reached and the setting transformation occurs.

The regime to the right of the line 30 of FIG. 2 may be referred to as the direct overwrite regime. The direct overwrite regime extends from the set state 60 through a plurality of intermediate states (generally depicted by 70) to a reset point or state 80 and beyond at higher amplitude currents. In FIG. 2, the x-axis is defined by the amplitude of the write pulse applied to the memory element. The width, rising edge, and falling edge of the write pulse are normally held relatively constant and in a typical embodiment may be 100 nsec, 10 nsec, and 1 µsec, respectively. After this pulse shape (such as pulse 20 in FIG. 1 is applied), the memory element (or bit) may be "read" by forcing a voltage less than $V_t$, such as 0.4V, across the memory element and measuring the resulting current. This voltage applied is divided by the measured current and results in a measured resistance that is plotted on the y-axis above the x-axis current amplitude applied.

The various points in the direct overwrite regime may be referred to as direct overwrite states of the chalcogenide material. Selected direct overwrite states are marked with circles in FIG. 2. Structural transformations in the direct overwrite regime may be induced by applying an electric current or voltage pulse to a phase-change material. In the direct overwrite regime, the resistance of the phase-change material varies with the magnitude of the applied electric pulse. The resistance of a particular direct overwrite state is characteristic of the structural state of the phase-change material, and the structural state of a phase-change material is dictated by the magnitude of the applied current pulse in FIG. 2. The fractional crystallinity of the phase-change material decreases as the magnitude of the current pulse increases. The fractional crystallinity is highest for direct overwrite states at or near the set point 60 and progressively decreases as the reset state 80 is approached. The phase-change material transforms from a structural state possessing a contiguous crystalline network at the set state 60 to a structural state that is amorphous or substantially amorphous or partially-crystalline without a contiguous crystalline network at the reset state 80. The application of current pulses having increasing magnitude has the effect of converting portions of the crystalline network into an amorphous phase and ultimately leads to a disruption or interruption of contiguous high-conductivity crystalline pathways in the phase-change material. As a result, the resistance of the phase-change material increases as the magnitude of an applied current pulse increases in the direct overwrite region.

In contrast to the accumulating region, structural transformations that occur in the direct overwrite region are reversible and bi-directional. As indicated hereinabove, each state in the direct overwrite region may be identified by its resistance and an associated current pulse magnitude, where application of the associated current pulse magnitude induces changes in fractional crystallinity that produce the particular resistance state. Application of a subsequent current pulse may increase or decrease the fractional crystallinity of an existing resistance state of the phase-change material. If the subsequent current pulse has a higher magnitude than the pulse used to establish the existing state, the fractional crystallinity of the phase-change material decreases and the structural state is transformed from the existing state in the direction of the reset state along the direct overwrite resistance curve. Similarly, if the subsequent current pulse has a lower magnitude than the pulse used to establish the existing state, the fractional crystallinity of the phase-change material increases and the structural state is transformed from the existing state in the direction of the set state along the direct overwrite resistance curve.

The direct overwrite states of the phase-change material are most commonly used to define memory states of a memory device. The memory elements in each cell may be binary memory devices that utilize two of the direct overwrite states as memory states, where a distinct data value (e.g. "0" or "1") is associated with each state. Each memory state thus corresponds to a distinct structural state of the phase-change material and readout or identification of the state can be accomplished by measuring the resistance of the material (or device) since each structural state is characterized by a distinct resistance value. The operation of transforming a phase-change material to the structural state associated with a particular memory state may be referred to herein as writing to the phase-change material.

Figure 3:
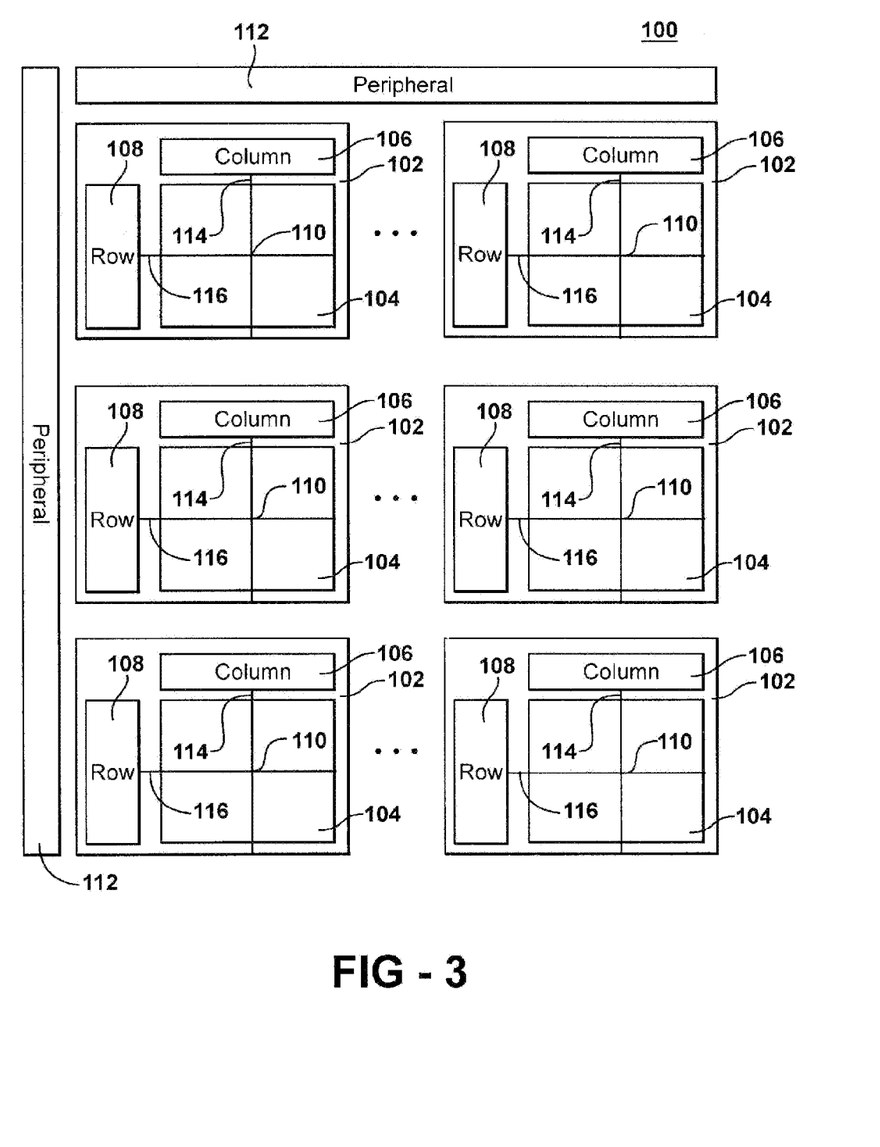
FIG. 3 depicts an electronic memory circuit that includes an electronic memory array and accompanying peripheral circuitry.
Figure 4:
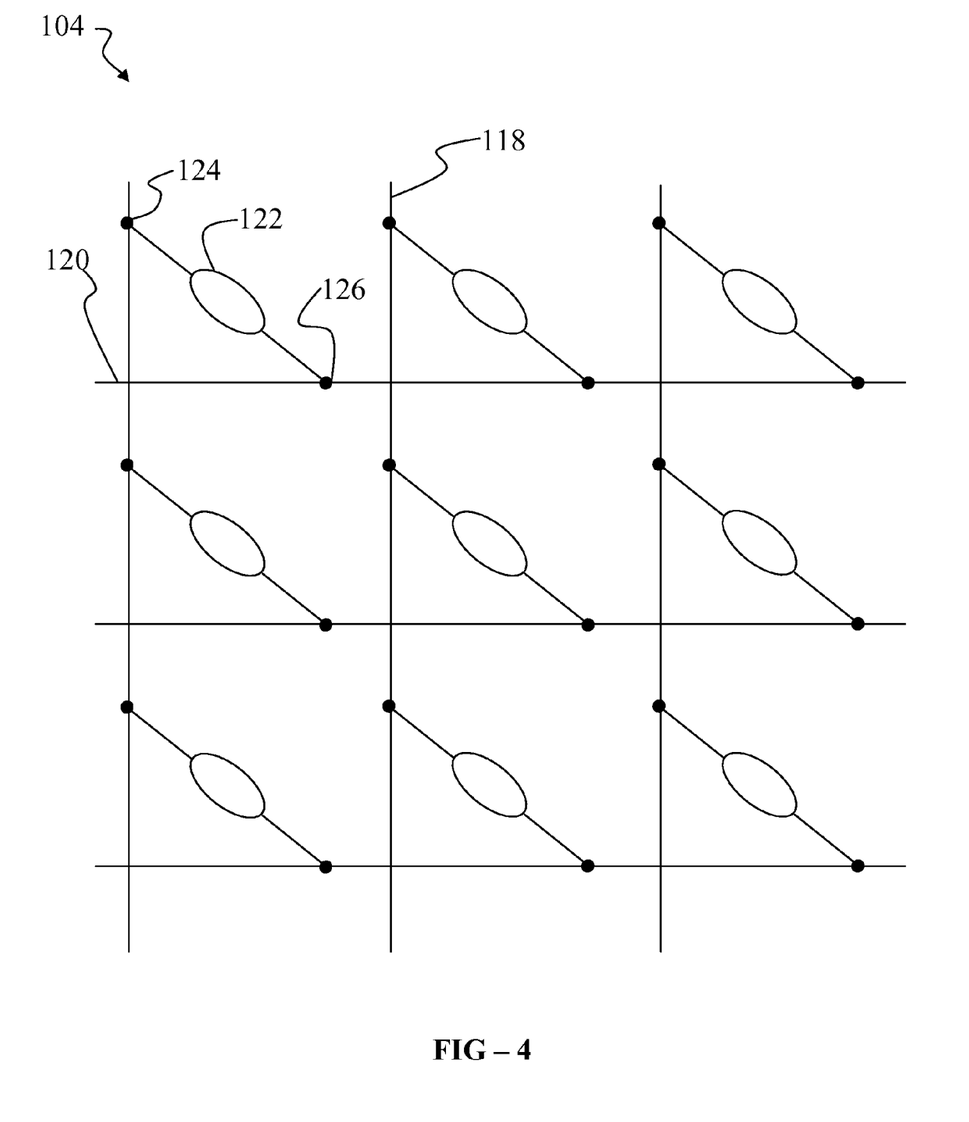
FIG. 4 depicts a representative memory array portion of an electronic memory circuit.
Figure 5:
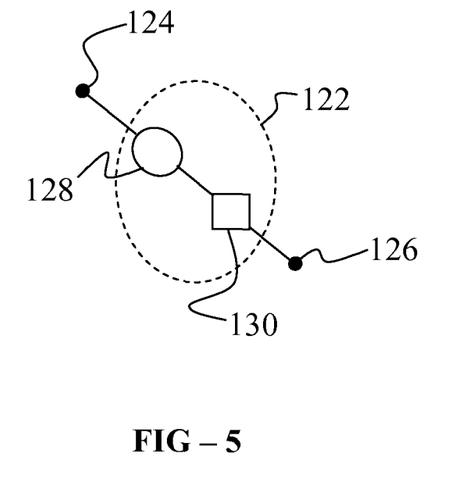
FIG. 5 depicts a representative memory cell within a memory array.

FIG. 3 depicts a representative configuration of an electronic memory circuit. Memory circuit 100 includes an array of memory blocks 102 and peripheral support circuitry 112. Each memory block 102 includes an array of memory cells 104 along with column line driver circuitry 106 and row line driver circuitry 108. Column lines may also be referred to herein as bit lines and row lines may also be referred to herein as word lines. A more detailed depiction of memory array 104 is presented in FIG. 4. FIG. 4 shows that memory array 104 includes column lines 118, row lines 120, and memory cells 122 coupled between column lines 118 and row lines 120 at nodes 124 and 126. Column lines 118 are connected to column line driver 106 and row lines 120 are connected to row line driver 108. Memory cell 122 includes at least a memory device with an active memory material. Memory cell 122 may further include an access or isolation device to regulate access to the memory device and minimize stray currents and leakage currents. The access device may be a transistor, diode or threshold switching device (such as an Ovonic threshold switching device). In the embodiment of FIG. 5, for example, memory cell 122 includes phase-change memory device 128 and access device 130 coupled between nodes 124 and 126.

Peripheral circuitry 112 in FIG. 3 includes row and column decoders and drivers, data and address buffers, sense amplifiers, and current sources. Peripheral circuitry 112 provides top-level decoding for access to memory blocks 102. Peripheral circuitry 112 switches or enables the appropriate read or write buffers, sense amplifiers, and current sources into the selected one of memory blocks 102. Memory circuit 100 receives an input address signal corresponding to selected memory cell 110 in array 104, decodes it to identify selected column line 114 and selected row line 116 of selected memory cell 110, and accesses (reads or writes) selected memory cell 110 by providing an appropriate drive current to selected column line 114 and/or selected row line 116 via column line driver 106 and row line driver 108.

Memory array 104 shown in FIG. 4 is an idealization in which the only connections between column lines 118 and row lines 120 occur through coupling via memory cells 122. In practice, however, manufacturing processes have limitations that introduce configuration defects into electronic memory arrays. The limitations include human error, failure of automation or process units, design flaws, and inherent limitations in process methodology. Configuration defects may also arise after manufacture due to fatigue or failure during the operational life of the memory circuit.

Configuration defects are defects, typically related to the structure, composition, or arrangement of elements within a memory circuit, that alter the intended pattern of electrical connectivity. As noted, it is generally desirable for connections between row lines and column lines to occur only through memory cells 122. The presence of configuration defects leads to unintended, missing or misconfigured electrical connections between circuit elements that impair the performance or operation of the memory array. Configuration defects include open circuits and short circuits. Open circuits may occur within row lines, column lines, or the memory devices that couple row lines and column lines. Open circuit defects arise when gaps or breakages occur in conductive lines or within conductive elements. Short circuits can occur within a memory cell, causing a lower resistance or actual short between the row and column lines associated with the particular cell. Short circuits may also occur between row lines, between column lines. between row lines and column lines. Short circuits represent undesirable electrical connection pathways created by defects between row lines, column lines, and/or row to column lines that circumvent memory cells or the active regions thereof, thereby reducing read and/or write margin.

Figure 6:
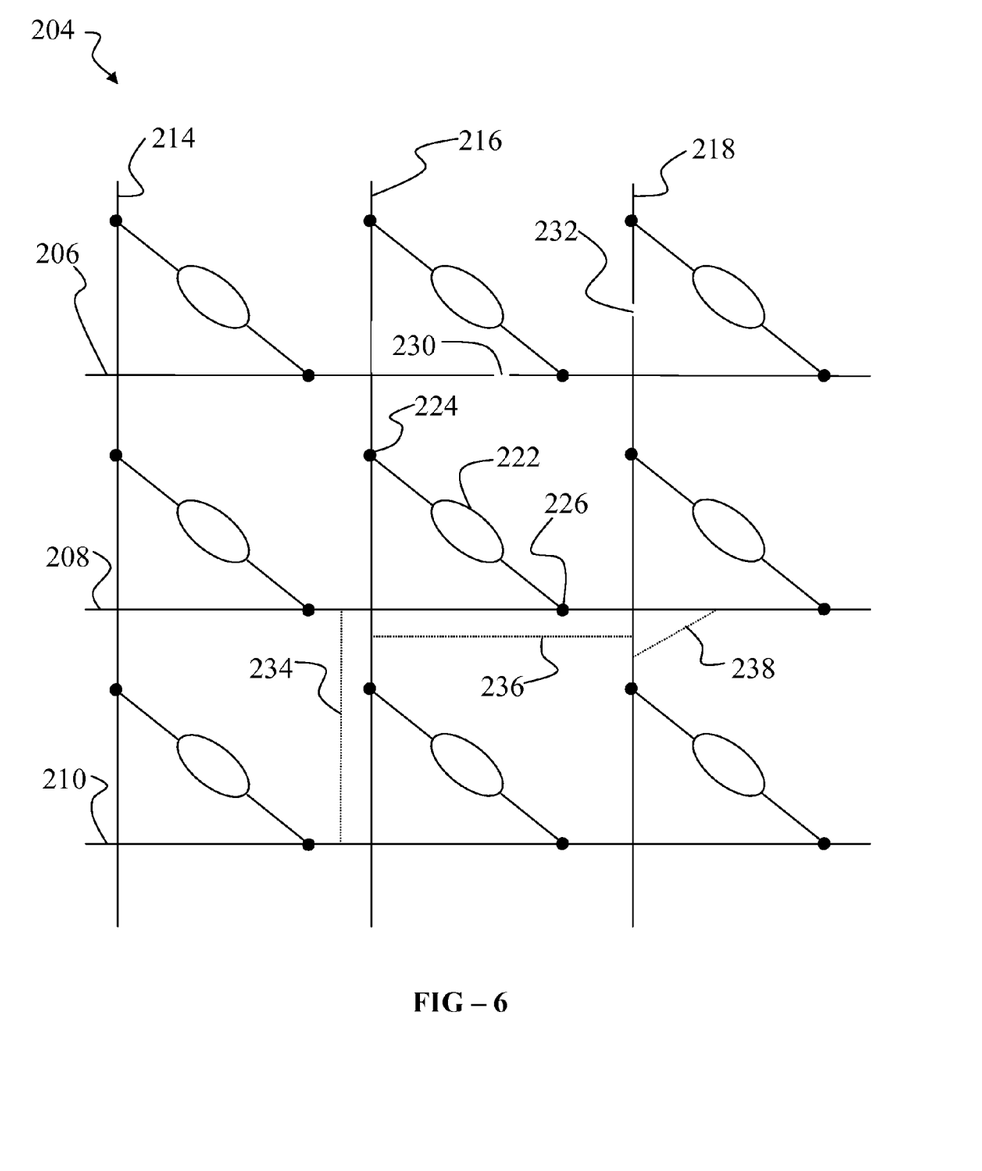
FIG. 6 depicts a representative memory array portion of an electronic memory circuit that includes short circuits.

FIG. 6 illustrates a memory array having configuration defects. Memory array 204 includes column lines 214, 216, and 218; row lines 206, 208, and 210, and memory cells 222 coupled between a column line and a row line at nodes 224 and 226. Memory array 204 further includes open circuit defect 230 within a row line, open circuit defect 232 within a column line, row-to-row short circuit defect 234, column-to-column short circuit defect 236, and row-to-column short circuit defect 238. Although short circuit defects 234, 236, and 238 are depicted between adjacent row and column lines in FIG. 6, such defects may potentially occur between any combination of row and/or column lines within memory array 204.

The presence of configuration defects leads to errors in reading data from memory cells, writing data to memory cells, or erasing data from memory cells. Configuration defects create the possibility that electrical access (reading, writing, erasing) signals directed to a selected memory cell will be ineffective in read or writing a memory cell bit or larger section of memory (sector or page). Such defects may also cause electrical access signals to be inadvertently directed to unselected memory cells or ground, and thereby either fail to write the selected cell to the intended state or write to an unselected cell. Misdirection of access signals means that reading and writing may occur from unintended memory cells or may fail altogether.

Consider, for example, the programming of memory cell 222 in FIG. 6. Memory cell 222 is coupled between row line 208 and column line 216. Memory cell 222 may be referred to as the selected memory cell, row line 208 may be referred to as the selected row line, and column line 216 may be referred to as the selected column line. The remaining memory cells, row lines, and column lines may be referred to as unselected.

In a conventional addressing scheme, unselected row lines 206 and 210 and unselected column lines 214 and 218 are held at their respective deselect voltages, while the selected row line 208 and selected column line 216 are driven to their respective select voltages (one of which is typically above the deselect voltage and the other of which is typically below the deselect voltage). The addressing scheme creates a potential difference between nodes 224 and 226 and causes an access current to flow through memory cell 222. The amplitude of the access current depends on the access operation and is lower for a read operation and higher for a write operation. The desired effect of the access operation will be affected, however, by the presence of a configuration defect such as row-to-row short circuit 234. When row line 208 is selected and current begins to flow through it, some or all of the current intended for node 226 may be diverted through row-to-row short circuit 234. As a result, the actual current reaching node 226 is less than the current needed to execute the desired access operation and an access error occurs. When writing, for example, diversion of current through row-to-row short circuit 234 causes the write current reaching node 226 to be less than that required to program selected memory cell 222 to the intended state and errors may occur because if the selected cell is written to an unintended state or the state of an unselected cell is altered by the diverted current. Such write errors ultimately must be corrected when the bit or bits are read. Similar errors occur upon selection of column line 216 due to the presence of column-to-column short circuit 236.

Errors associated with short circuit defects are compounded in the conventional addressing scheme used for memory arrays. The conventional addressing scheme is a sequential scheme in which the row line is fixed and the column lines are accessed in sequence across the row. When a defect such as row-to-row short circuit 234 is present, current flow along the entire row is affected and reduced below the current needed to accomplish the intended access operation. As a result, the presence of a row-to-row short circuit can influence the fidelity of addressing and accessing most or all of the memory cells along a row in a sequential access procedure. Since a memory array such as memory array 204 typically has a size of at least 512×512, the number of erroneous access operations is potentially very large and the need for error correction is commensurately high. Similar considerations apply to row-to-column short circuits and column-to-column short circuits.

In this invention, an alternative addressing scheme is presented to minimize the effect of short circuit defects on the need for error correction in a memory array. As noted above, the presence of short circuit defects can have consequences that extend throughout the memory cells of the affected rows and columns. In the instant addressing scheme, the effect of a short circuit defect on the integrity of data written to or retrieved from a memory array is limited to a small number of memory cells and the demand for error correction remains manageable and generally within the capabilities of a flash controller.

The instant invention seeks to contain the effect of short circuit defects by limiting current diversion through short circuits to minimize the number of memory cells subject to access errors as a consequence of the short circuit. The instant invention recognizes that diversion of current through a short circuit defect correlates with the voltage difference between the address lines (word lines and/or bits lines) interconnected by the short circuit and seeks to minimize that voltage difference, (or current measured, or current drained from the power supply) during an access (read, write, or erase) operation. In one embodiment, only one of the row line and column line of the selected memory cell is actively driven to a voltage different from all other row lines and column lines and the active drive of the selected row or column line is maintained only when all other row lines and column lines are left floating. As used herein, "floating" signifies that a row line or column line is not actively driven. Instead of being actively driven to a particular voltage, the voltage of a floating line (row or column) is unconstrained and freely evolves according to the signals and voltages it encounters within the array. By allowing unselected row and column lines to float, the addressing scheme limits the flow of current through short circuits because continued current flow to the unselected line (row or column) through a short circuit causes the voltage of the unselected line to evolve toward the voltage of the selected line (row or column). As a result, the potential difference between selected and unselected lines that are shorted together decreases, the driving force for current flow through the short circuit is reduced, and the current diverted through the short circuit is minimized. The tendency for short circuits to cause access errors is accordingly reduced, resulting in a less stringent demand for error correction.

A description of an illustrative embodiment of an addressing scheme according to the instant invention is now described. In the illustrative embodiment, the selected state of row (word) lines is assumed to be high, the unselected state of row (word) lines is assumed to be low, the selected state of column (bit) lines is assumed to be low, and the unselected state of column (bit) lines is assumed to be high. With this convention, the memory cell is configured so that access occurs when the row line is high and/or the column line is low. The choice of convention is arbitrary and may be readily reversed as would be apparent to one of ordinary skill in the art. Similarly, in the description of the instant addressing scheme that follows, one of ordinary skill in the art would appreciate that steps involving row lines and column lines can be interchanged.

In one embodiment, the instant addressing scheme begins with a precharge operation. The precharge operation may be performed upon power up, just before initiation of an active access cycle, or at the close of an active access cycle to place the memory array in a standby state in anticipation of a subsequent access cycle. In the precharge operation, the array is initialized to a precharge state in which all column lines and row lines are driven to an unselected state. In the precharge state, all row lines are driven low and all column lines are driven high. The precharge state can be established with the following steps: (1) float the column lines, (2) precharge the row lines high, (3) float the precharged row lines, (4) precharge the column lines, and (5) float the precharged column lines. Upon conclusion of the precharge operation, all row lines and columns are precharged to an unselected state and left floating. The memory array is in a precharge state that is ready for an access cycle. Alternatively, the precharge may be applied by reversing the order of precharge by acting on the column lines before the row lines and then acting on the row lines. In the precharge operation, only the row lines or column lines, but not both, are actively driven at any one time.

Variations of the precharge operation are also within the scope of the instant invention. If the time between the precharge operation and initiation of the access cycle is prolonged, the precharge operation may be repeated as necessary to counteract any decay that may occur in the voltages of the precharged row and column lines. Alternatively, the timing of the steps of the precharge operation can be synchronized with the timing of the access cycle. For example, persistent precharging of the column lines high may occur until some predetermined time before initiation of the next access cycle. At the predetermined time, the precharged column lines can be floated, the word lines can then be precharged low and floated, and the access cycle can be initiated. Alternatively, persistent precharging of the row lines low may occur until some predetermined time before initiation of the next access cycle. At the predetermined time, the row lines can be floated, the column lines can then be precharged high and floated, and the access cycle can be initiated. In these schemes, the delay over which the precharge voltage can decay is minimized to insure that the access cycle is performed on a properly precharged array.

In a further embodiment, the column lines may be held high until the time the access cycle is initiated. Although this scheme may lead to a residual leakage current, it permits rapid initiation of the access cycle. In embodiments in which precharging of the column lines high occurs immediately before initiation of the access cycle, the time needed to precharge the column lines represents a delay that may be undesirable in some applications. Accordingly, by maintaining the column lines high until the access cycle is initiated, the access cycle can occur without delay. This embodiment may be beneficial for memory arrays implemented in NMOS where the column lines are formed as $n^+$ regions. If the design goal is low power operation of a memory array, the column lines may be floated to reduce leakage current and precharged high just before initiation of the access cycle. As noted, however, this approach requires an adequate latency period (delay) before initiating the access cycle to insure that the column lines are precharged to the appropriate level.

The precharge operation is designed to precharge the row lines and column lines separately. Simultaneous precharging of row lines and column lines is avoided to minimize the effect of short circuit defects on the precharge state of the array. In one embodiment, the row lines are precharged to a common low state and the column lines are precharged to a common high state. By maintaining a common voltage state among row (or column) lines, the influence of row-to-row (or column-to-column) short circuits is minimized and it is expected that all row (or column) lines will precharge to the intended state. The precharge operation may be sequential or alternated periodically.

As a further alternative where the select switch is an Ovonic Threshold Switch (OTS) in series with the memory elements (e.g. PCM or RRAM), the precharge may be to the mid-point by actively driving both the row and column lines to the same voltage (V/2). Then, read may proceed by selecting a row and column line, respectively, to a voltage to read the cell. Similarly for write, the row and column line may be respectively selected to the appropriate voltage. However, if a V/3 (or something other than V/2) method of selection is used, the columns may be floated, the (unselected) row line may be forced (to, for example, V/3), the row lines may then be floated, and the column lines may then be driven to 2V/3 (or some voltage greater than V/2 to improve margin). Subsequently, the column lines may be floated and the selected row and column may then be driven to read or write the selected cell.

Following conclusion of the precharge operation, the access cycle may occur. The access cycle includes initiation, execution, and termination operations. Illustrative examples of each operation are now described. The access cycle entails selection of a target cell, providing sufficient current to the target cell for a sufficient period of time and with proper waveform characteristics to achieve the desired access operation (read, write, erase), and ending the cycle by returning the target cell to its unselected state. Selection of the target cell generally occurs by changing the state of the row line associated with the target cell from its unselected (low) state to its selected (high) state. The column line associated with the target cell may optionally be changed from its unselected (high) state to its selected (low) state. The target cell may also be referred to herein as the selected cell.

Initiation of the access cycle begins by providing addresses to the peripheral circuitry that controls operation of the memory array. The addresses typically encode the selected row line, the selected column line, and the type of access operation. If the intended access operation is a write operation, the intended programming state (e.g. "0" or "1") is also encoded. The addresses may be provided to the peripheral circuitry either directly or through a controller. Addresses may be provided individually, in groups, or incremented according to a pre-determined pattern. In one embodiment, the pre-determined pattern is a diagonal pattern of sequential selection within a sector (or page). The diagonal pattern is described in U.S. Pat. No. 7,149,934 by Shepard, the disclosure of which is incorporated by reference herein. The diagonal pattern is beneficial because it improves error correction capacity for a given algorithm (Hamming or X-Y, e.g. Reed-Solomon) by limiting the number of bits fetched from any given row or column during an access operation. For example, either 1, 2, 3, or 4 bits maximum may be accessed for a given row or column within a sector or page, with the best ECC correction by limiting access to 1 bit per row or column within a sector or page.

The address of the selected cell is decoded and the selected row line is actively driven high to place it in its selected state. In one embodiment, one or more capacitors are precharged high before driving the selected row line high. The row line may be actively driven high and then disconnected from the active drive and connected to the capacitance precharged high. Alternatively, the row line may be connected to the capacitance to precharge high. Before selecting the bit line low, the row line is thereby disconnected from the active drive (which may be a power supply forced to the chip or a pumped power supply generated on-chip). Thereby, a short from row to column only discharges the precharged capacitance instead of forcing excess current from the power supply or discharging the pumped voltage generated on-chip.

In one embodiment, the one or more capacitors are precharged with sufficient energy to program the selected memory cell. The memory array is configured so that the one or more capacitors may be reversibly connected to and disconnected from the selected row line. The purpose of the one or more capacitors is to provide control over the capacitance of the selected row line. Capacitance affects the timescale of charge decay through the RC time constant of the selected row line. Higher capacitance leads to a larger time constant and a slower decay of charge, while lower capacitance leads to a smaller time constant and a faster decay of charge. The ability to freely connect or disconnect the selected row line with one or more precharged capacitors thus facilitates control over the rate of decay or dissipation of charge from the selected row line to the selected memory cell.

The rate of charge decay through the selected memory cell corresponds to an access current and is an important consideration in accessing memory cells that use a phase-change material as the active material. The rate of charge decay has particular importance in write (program or erase) operations and the capacitance is sized to approximate the decay rate needed on the trailing edge of the write pulse to achieve an intended state. As described hereinabove, the memory states of phase-change memory are structural states that differ in resistance according to the relative proportions and/or physical arrangement of crystalline and amorphous phase regions. The memory states are typically bounded by a low resistance set state whose resistance is primarily controlled by crystalline phase regions and a high resistance reset state whose resistance is primarily controlled by amorphous phase regions. Programming (writing) a phase-change memory cell to the set state requires use of a current pulse with a slowly decaying trailing edge, while programming a phase-change memory cell to the reset state requires use of a current pulse with a quickly decaying trailing edge. (See FIG. 1 above.) The slowly decaying trailing edge needed to program the set state can be achieved in the scheme of the instant invention by connecting the selected row line to the one or more precharged capacitors during the access operation. The quickly decaying trailing edge needed to program the reset state can be achieved by keeping the selected row line disconnected from the one or more precharged capacitors.

To initiate the access operation, the selected row line is actively driven high, optionally connected to one of the precharged capacitors, and all other array lines are floated. The active drive of the selected row line is then normally discontinued by disconnecting the selected row line from the drive power supply (which may either by on-chip or off-chip). Disconnecting the selected row line from the drive power supply limits the access current that develops from the charge accumulated on the selected row line (and, if connected, the one or more precharged capacitors). Current from the drive power supply is prevented from flowing to the memory cell and the possibility of overdriving and damaging the memory cell is avoided (by preventing excess current from the power supply (on or off chip)).

Depending on the current required for the access operation and the current limiting capacity of the circuit, however, it may be possible to maintain the active drive of the selected row line during the duration of the access cycle, for either or both of the write or read cycles. In a read cycle, for example, the read voltage and drive current may be sufficiently low or limited by the driver circuit to insure that the current delivered to the memory cell is within a safe range. By way of example, the drain of the active driver of the selected row in a read cycle may be connected to a pull-up sense amplifier, load resistor or current source across which the read voltage of the selected memory cell is sensed. If the sense amplifier or load resistor adequately limits current, the time over which the selected row line is connected to the driver need not be limited and the active drive need not be discontinued. If necessary to assist (speed up) the initial pull-up of the selected row line, the sense amplifier or load resistor can be temporarily bypassed (with, for example, a transistor shorted across the sense amplifier or load resistor) to permit higher current flow. The typical active drive current that needs to be supplied to the selected row line during a write operation is expected to be too high to permit continuation of the active drive current during a write cycle if the row and/or bit line is shorted.

At this stage of the access cycle, the selected bit line is actively driven high and all other array lines are floating. The selected bit line may or may not be connected to one or more precharged capacitors and may or may not be connected to the active drive power supply.

The next step is execution of the access cycle. To execute the access cycle, the column line of the selected memory cell is actively driven to its selected (low) state to pull the selected row line low and induce flow of the current needed to perform the access operation. In a typical array, one or more devices are connected in series between the column lines and ground and the selected column line is driven low by turning on the devices to establish a connection between the selected column line and ground. Devices interconnecting column lines to ground may include transistors, diodes, SCR's, or other devices that are switchable between on and off states. When all of the devices interconnecting the selected column line to ground are turned on, the selected column line is actively pulled to ground. The connections between unselected column lines and ground remain open. The unselected column lines remain floating and in their unselected (high) precharge state.

In the execution operation, the selected row line is high, the selected column line is low and current flows through the memory cell. If the access cycle is a read cycle, the current passing between the selected row line and selected column line through the selected memory cell is sensed as a voltage across a load resistor and the access cycle is terminated. The sensed voltage is controlled by the resistance state of the selected phase-change memory cell. If the phase-change memory cell is in a high resistance state, the current flowing through the memory cell is low and the sensed voltage is high. If the phase-change memory is in a low resistance state, the current flowing through the memory cell is high and the sensed voltage is lower (since the total voltage across the load resistor is greater).

If the access cycle is a write cycle, the steps of the execution operation depend on whether the selected memory cell is to be programmed to a low resistance state (e.g. the set state) or a high resistance state (e.g. a reset state). As noted above, when writing to a set (low resistance) state, it may be desirable for the programming pulse to have a gradually decaying falling edge to insure adequate time to permit crystallization. When writing to a reset state, in contrast, it may be desirable for the programming pulse to have either a higher amplitude or a faster decaying falling edge to quench in a disordered amorphous state before appreciable crystallization occurs. In the write operation, for one embodiment, the unselected rows and then columns are sequentially precharged to the unselected voltage state, the selected word line driver is made active and pulls up the selected word line, and then the selected word line is connected to a capacitor that supplies current, and the selected bit (column) line driver is activated. The access current originates from the decay of the charge stored on the selected row line (and its capacitor, if connected) during the time it is actively driven high. Then, for example, to achieve a particular programming state in PCM, the rate of decay of the charge stored on the selected row line is controlled by the path through the selected memory cell (and its inherent resistance during programming). As noted above, the rate of charge decay is controlled by the capacitive load and the capacitive load can be controlled by connecting the selected row line to one or more precharge capacitors. To achieve the gradual charge decay needed to program the selected memory cell to the low resistance (set) state, the selected row line is connected to (or allowed to remain connected to) one or more of the precharged capacitors to increase the capacitive load and slow the decay of charge. Conversely, to achieve the rapid charge decay needed to program the selected memory cell to the high resistance (reset) state, the selected row line is disconnected from (or never connected to) one or more of the precharged capacitors to minimize the capacitive load and insure rapid pull down of the selected row line by the selected column line. In one embodiment, the decay of charge from the selected row line is additionally facilitated by actively driving the selected row line low with a quench line interconnected to the row line with a diode or transistor. The quench line acts in concert with the selected column line (floated (and thereby pulled high)) to expedite the decay of charge from the selected row line to insure a fast edge rate.

Upon completion of the execution operation, the desired read value has been retrieved from or the desired data value has been written to the selected memory cell. The access cycle is next terminated by disconnecting the selected row line from any remaining active drivers or precharged capacitors to which it may still be connected. The connection of the selected column line to ground is also discontinued by turning off one or more of the transistors or other series devices that interconnect the selected column line to ground. After completion of the termination operation, the array may once undergo the precharge operation sequence described hereinabove to prepare the array for the next access cycle. The one or more capacitors to which the selected row line may be connected may also be precharged high in anticipation of the next access cycle at this time. To increase bandwidth, more than one capacitor may be used per array, so that at least one capacitor is precharging during the entire access cycle, while one or more others are being connected and discharged by the selected row line during write.

Inclusion of multiple (or larger) capacitors also provides a strategy to account for column-to-column shorts. If the selected column line is shorted to another column line, the operation of actively driving the selected column line to ground will induce two pull-down currents: one through the memory cell at the crosspoint of the selected row line and selected column line, and one through the memory cell at the crosspoint of the selected row and the unintended column line shorted to the selected column line. The two pull-down currents operate in parallel. The unintended pull-down current provides an alternative channel of decay and has the effect of doubling the rate of decay of charge from the selected row line. To compensate for the doubled decay rate, it is necessary to double the capacitance available to connect with the selected row line. By doing so, the intended decay rate through the selected cell can be preserved despite the presence of the short.

If two column lines are shorted together, the memory array can be configured to provide a series of two capacitors or a single capacitor with doubled capacitance for connection to the selected row line. By way of example, if the desired charge decay time for a write operation is 1 μs and this timescale can be achieved with a capacitance of 50 pF for a particular memory cell in a particular array in the absence of a short, then two 50 pF capacitors or one 100 pF capacitor should be made available to the selected row line to compensate for a short between two column lines. Similarly, if four column lines are shorted together, the available capacitance should be increased to 200 pF.

To minimize delay, a differentiator can be included in the circuit to sense the rate of fall of the selected column line. In one embodiment, the differentiator is a component of a read control circuit included in a sense amplifier. The sense amplifier is connected to the selected column line and includes a buffer that provides a buffered voltage corresponding to the selected bit line voltage as an output. A voltage signal from the selected bit line is provided to one input terminal of the buffer and the differentiator is connected to the second input of the buffer. The differentiator includes a capacitor and a resistor. The capacitor is serially connected with the buffer, where one terminal of the capacitor is connected both to the second input of the buffer and the output of the buffer. The other terminal of the capacitor is connected to a resistor that is connected to ground. In this configuration, the voltage at a node between the capacitor and resistor provides a derivative voltage that corresponds to the time derivative of the selected bit line voltage. The signal at the node provides a measure of the time rate of decay of the signal on the selected column line. If the rate of fall is slower than desired for a particular application, the array may include unused ("dummy") bit lines that can be selected and used to pull down the selected word line. Alternatively, the differentiator can force added current to adjust the fall time to achieve the desired value. Further information on the use and configuration of a differentiator to sense the time derivative of charge or voltage on a selected bit line during an access operation may be found in U.S. Pat. Nos. 7,154,774; 7,388,775; 7,495,944; 7,570,524; the disclosures of which are incorporated by reference herein.

The instant invention provides a robust addressing scheme for minimizing the demand for error correction caused by short circuit defects in a memory array. The instant addressing scheme manages row-to-row, column-to-column, and row-to-column short circuits to minimize the need for error correction and maintain error correction demands within manageable limits. In one embodiment, the need for error correction is maintained within the capabilities of standard flash controllers.

Since all row lines are actively driven in unison during the precharge operation, row-to-row shorts do not affect the precharge process. If all row lines are driven to a common unselected (low) voltage during precharge, there is no potential difference between shorted row lines and no driving force for current flow between row lines. As a result, all row lines are expected to be driven to the proper unselected state during the precharge operation and excess current through the array is avoided. Column-to-column shorts are likewise not expected to interfere with the precharge operation since all column lines are driven to a common unselected (high) voltage during precharge.

The effect of row-to-row shorts on the initiation operation of the access cycle is limited to a manageable degree. If the selected row line is shorted to another row line, two row lines are driven high (pulled up) upon selection of the selected row line during initiation of the access operation. The shorting of the selected row line to another row line is tolerable, however, because when the selected column line is driven low in the execution operation of the access cycle, the effect of the short can be limited to just two cells instead of infecting most or all of a row. That is, the row-to-row short causes errors in reading (during a read access cycle) or writing (during a write access cycle), but the misread or miswrite can be limited to the selected memory cell and a single other memory cell in the unselected shorted row line along the selected column line through an indexing scheme, such as the diagonal scheme mentioned hereinabove, that increments the row address after accessing one, two or perhaps a small number of memory cells along the selected row line. As a result, the number of read or write errors caused by a row-to-row short during a page or sector fetch is maintained within a manageable limit (such as the error correction capacity of a flash controller). The effect of shorted row lines is limited to just the mutually-shorted row lines in this scheme. The problem encountered in the prior art where a short at some position in a row causes errors in all other bits in the row is eliminated and it becomes possible to remain within the error correction capability of a conventional flash controller. Analogous reasoning applies when considering the effect of column-to-column shorts on the frequency of errors that arise when the selected column line is actively driven low during the execution operation of the access cycle.

Row-to-column shorts may occur between the selected row line and selected column line through the selected memory cell or between a selected row (column) and unselected column (row) line. In either instance, the effect on the precharge operation or access cycle is minimal because the instant addressing scheme avoids simultaneous active drive of row and column lines. During the precharge operation, all column lines are floated while the row lines are precharged and all row lines are floated while the column lines are precharged. As a result, any current diverted through a row-to-column short during the precharge operation is limited. Suppose, for example, that a row-to-column short is present as the row lines are precharged. Since the column lines are floating, the presence of a row-to-column short has the effect of pulling the shorted column to the voltage of the row lines so that the potential across the row-to-column short equalizes and any current diverted through the short is minimal. Since the row lines are floating while the column lines are precharged, any current diverted through the short during precharge of the column lines is likewise minimal. Similar reasoning applies when considering the effect of row-to-column shorts on read and write operations during an access cycle.

In addition to limiting the number of memory cells requiring correction, the instant addressing scheme further prevents inadvertent draw of excess current through short circuits. This follows because after the precharge operation is completed, all row lines and column lines are floated before selection of a row line in the initiation operation of the access cycle and before selection of a column line in the execution operation of the access cycle. In the initiation operation, only the selected row line is actively driven. All other array lines are floating. As a result, any current diverted through a short has the effect of equalizing or pulling up the potential of the row or column line shorted to the selected row line. An excess (and potentially damaging) current drive is thereby avoided. Analogous reasoning applies when considering shorts with the selected column line when the selected column line is actively driven low during the execution operation.

Further reasoning applies when considering the effect of row-to-column shorts on current draws during read or write operations of an access cycle. If the selected row line is shorted to the selected column line, a compliance or load resistor may be used to limit current as described above to prevent excess currents. If the selected row line is shorted to an unselected column line, the current is limited by load resistor in series with row line driver during read. During write, the current is limited because the selected row line is connected to a capacitor as described above and both are floated before the selected column line is driven low during the execution operation. As a result, selection of the column line merely drives the selected row line faster without pulling an excess current. Although a miswrite occurs due to the change in pull down rate, it is limited to the shorted row and column and remains within a manageable error correction capacity.

General design goals achieved by the instant invention include assuring that array current is not excessive during read or write access operations and assuring that the read and write margin of the selected memory cell is not adversely affected by short circuit defects in the array. Margin is compromised by diversion of current through short circuits. By limiting the influence of short circuits on current flow and discharge rate, the effects of short circuits are localized and maintained within reasonable limits. Thereby, any on-chip pumped power supplies are not compromised too low during one cycle so that the next cycle may resume with the proper voltages and timing. The fidelity of operation of the remaining memory cells in the array is accordingly preserved.

Excess array current in the presence of short circuits is avoided during a write operation in the scheme of the instant invention because active drive is applied to only a single column line or a single row line at a time. By avoiding active drive of both sides of a short circuit defect, the instant invention prevents excess current flow. By limiting active drive to a single selected row line or column line and floating all other array lines, the effect of a short circuit is limited to an equalization (pull up or pull down) of potentials across the short circuit so that excess current is prevented.

The approach of the instant invention tolerates row-to-row, column-to-column, and row-to-column shorts in the array and prevents failures from exceeding manageable levels. In particular, in one embodiment, failures are within the error correction capacity of a standard flash controller. Accordingly, the cost and performance disadvantage of fuse repair is avoided.

To avoid additional transient current and delay that may result from changing the selected row and column after each memory cell access (such as would occur with a diagonal address sequence as described above), two memory cells may be sequentially selected and accessed in each row and/or column (with reduced, but nonetheless manageable, fault tolerance). In addition, the row and column decoder may be pre-decoded so multiple row drivers drive the drain of the transistor (Vpr) with the source of the transistor connected to the row line and the gate to the decoder. By way of example, if 8 lines are run and connected to every $8^{th}$ transistor along the array, the capacitance can be reduced by about 8:1. Similarly, in the column, precharging can be avoided and gates driven directly so address lines are changed only on the address bit changing.

The instant invention also accommodates open circuit failures in row lines or column lines because as with short circuit failures, errors caused by open circuit failures are limited to only a small number of memory cells and excess current to the chip or through the array is similarly avoided.

Those skilled in the art will appreciate that the methods and designs described above have additional applications and that the relevant applications are not limited to those specifically recited above. Also, the present invention may be embodied in other specific forms without departing from the essential characteristics as described herein. The embodiments described above are to be considered in all respects as illustrative only and not restrictive in any manner.

We claim:
1. A method of operating a memory array comprising:
   providing a memory array, said memory array including a plurality of first conductive lines and a plurality of second conductive lines, each of said first conductive lines being coupled to one of said second conductive lines with a memory cell;
   providing a first active drive, said first active drive charging said first conductive lines, said first active drive occurring while floating said second conductive lines;
   terminating said first active drive and floating said first conductive lines; and providing a second active drive, said second active drive charging said second conductive lines, said second active drive occurring while floating said first conductive lines.

2. The method of claim 1, wherein said memory cells include a non-volatile memory cell.

3. The method of claim 1, wherein said memory cells include a phase-change memory cell.

4. The method of claim 1, wherein said memory cells include a resistive RAM memory cell.

5. The method of claim 1, wherein said memory cells include a memristor.

6. The method of claim 1, wherein said memory cells include an FeRAM memory cell.

7. The method of claim 1, wherein said memory cells include an MRAM memory cell.

8. The method of claim 1, wherein said first active drive comprises providing charge from a charge pump.

9. The method of claim 1, further comprising charging a capacitor.

10. The method of claim 9, further comprising connecting one of said first conductive lines to said capacitor.

11. The method of claim 1, wherein said first conductive lines are charged to a different state than said second conductive lines.

12. The method of claim 11, wherein said first active drive charges said first conductive lines high and said second active drive charges said second conductive lines low.

13. The method of claim 1, wherein said second active drive comprises connecting said second conductive lines to ground.

14. The method of claim 1, further comprising:
terminating said second active drive and floating said second conductive lines.

15. The method of claim 14, further comprising selecting a first of said first conductive lines, said selecting a first of said first conductive lines comprising providing a third active drive, said third active drive charging said first selected of said first conductive line, said third active drive occurring while the non-selected of said first conductive lines and said second conductive lines are floating.

16. The method of claim 15, wherein said third active drive charges said first selected of said first conductive line high.

17. The method of claim 15, further comprising terminating said third active drive and floating said first selected of said first conductive lines.

18. The method of claim 17, further comprising discharging current from said first selected of said first conductive lines, said discharged current flowing through at least one of said memory cells.

19. The method of claim 17, further comprising selecting a first of said second conductive lines, said selecting said first of said second conductive line comprising providing a fourth active drive, said fourth active drive charging said first selected of said second conductive lines, said fourth active drive occurring while said first conductive lines and the non-selected of said second conductive lines are floating.

20. The method of claim 19, wherein said fourth active drive comprises connecting said first selected of said second conductive lines to ground.

21. The method of claim 19, wherein said fourth active drive induces current flow through the memory cell coupled between said first selected of said first conductive lines and said first selected of said second conductive lines.

22. The method of claim 21, wherein said memory cell comprises a phase-change material.

23. The method of claim 22, wherein said current flow alters the structural state of said phase-change material.

24. The method of claim 23, wherein said current flow increases the crystalline volume fraction of said phase-change material.

25. The method of claim 19, further comprising terminating said fourth active drive and floating said first selected of said second conductive lines.

26. The method of claim 25, further comprising selecting a second of said first conductive lines, said selecting said second of said first conductive lines comprising providing a fifth active drive, said fifth active drive charging said second selected of said first conductive lines, said fifth active drive occurring while the non-selected of said first conductive lines and said second conductive lines are floating.

27. The method of claim 26, wherein said second selected of said first conductive lines coincides with said first selected of said first conductive lines.

28. The method of claim 27, wherein said second selected of said first conductive lines is not adjacent to said first selected of said first conductive lines in said array.

29. The method of claim 28, further comprising selecting a second of said second conductive lines, said selecting said second of said second conductive lines comprising providing a sixth active drive, said sixth active drive charging said second selected of said second conductive lines, said sixth active drive occurring while the non-selected of said second conductive lines and said first conductive lines are floating.

30. The method of claim 29, wherein said second selected of said second conductive lines is not adjacent to said first selected of said second conductive lines in said array.

31. The method of claim 15, wherein said selecting further comprises connecting said first selected of said first conductive lines to a capacitor.

32. The method of claim 31, wherein said capacitor is precharged.

33. The method of claim 31, further comprising terminating said third active drive and floating said first selected of said first conductive lines.

34. The method of claim 33, further comprising discharging current from said first selected of said first conductive lines or said capacitor, said discharged current flowing through at least one of said memory cells.

35. The method of claim 33, further comprising selecting a first of said second conductive lines, said selecting said first of said second conductive line comprising providing a fourth active drive, said fourth active drive charging said first selected of said second conductive lines, said fourth active drive occurring while the non-selected of said second conductive lines and said first conductive lines are floating.

36. The method of claim 35, wherein said fourth active drive comprises connecting said first selected of said second conductive lines to ground.

37. The method of claim 35, wherein said fourth active drive induces current flow through the memory cell coupled between said first selected of said first conductive lines and said first selected of said second conductive lines.

38. The method of claim 37, wherein said memory cell comprises a phase-change material.

39. The method of claim 38, wherein said current flow alters the structural state of said phase-change material.

40. The method of claim 39, wherein said current flow increases the amorphous volume fraction of said phase-change material.

41. The method of claim 35, further comprising terminating said fourth active drive and floating said first selected of said second conductive lines.

42. The method of claim 41, further comprising selecting a second of said first conductive lines, said selecting said second of said first conductive lines comprising providing a fifth active drive, said fifth active drive charging said second selected of said first conductive lines, said fifth active drive occurring while the non-selected of said first conductive lines and said second conductive lines are floating.

43. The method of claim 42, wherein said second selected of said first conductive lines coincides with said first selected of said first conductive lines.

44. The method of claim 43, wherein said second selected of said first conductive lines is not adjacent to said first selected of said first conductive lines in said array.

45. The method of claim 44, further comprising selecting a second of said second conductive lines, said selecting said second of said second conductive lines comprising providing a sixth active drive, said sixth active drive charging said second selected of said second conductive lines, said sixth active drive occurring while the non-selected of said second conductive lines and said first conductive lines are floating.

46. The method of claim 45, wherein said second selected of said second conductive lines is not adjacent to said first selected of said second conductive lines in said array.

* * * * *